(12) United States Patent
Uesaka

(10) Patent No.: US 8,502,621 B2
(45) Date of Patent: Aug. 6, 2013

(54) LADDER FILTER AND DUPLEXER

(75) Inventor: Kenichi Uesaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/610,971

(22) Filed: Sep. 12, 2012

(65) Prior Publication Data
US 2013/0002372 A1 Jan. 3, 2013

Related U.S. Application Data

(63) Continuation of application No. PCT/JP2011/055787, filed on Mar. 11, 2011.

(30) Foreign Application Priority Data

Mar. 19, 2010 (JP) ................................. 2010-064731

(51) Int. Cl.
*H01L 41/00* (2013.01)
*H03H 9/46* (2006.01)

(52) U.S. Cl.
USPC .......................................... 333/133; 333/193

(58) Field of Classification Search
USPC ........................... 333/133, 193, 194, 195, 196
See application file for complete search history.

(56) References Cited

U.S. PATENT DOCUMENTS

| | | | |
|---|---|---|---|
| 5,999,069 A | 12/1999 | Ushiroku | |
| 6,351,197 B1 | 2/2002 | Selmeier et al. | |
| 7,271,684 B2 * | 9/2007 | Nishihara et al. | 333/133 |
| 7,446,455 B2 * | 11/2008 | Iwasaki et al. | 310/321 |
| 2003/0186673 A1 | 10/2003 | Kimachi et al. | |
| 2009/0096551 A1 * | 4/2009 | Yamagata | 333/193 |
| 2009/0273408 A1 | 11/2009 | Inoue et al. | |
| 2010/0127800 A1 | 5/2010 | Sakuraba | |
| 2010/0148887 A1 | 6/2010 | Matsuda et al. | |

FOREIGN PATENT DOCUMENTS

| | | |
|---|---|---|
| JP | 11-055067 A | 2/1999 |
| JP | 2000-174586 A | 6/2000 |
| JP | 2000-201052 A | 7/2000 |
| JP | 2001-510950 A | 8/2001 |
| JP | 2002-300003 A | 10/2002 |
| JP | 2003-298392 A | 10/2003 |
| JP | 2008-118192 A | 5/2008 |
| JP | 2009-088999 A | 4/2009 |
| JP | 2009-272666 A | 11/2009 |
| WO | 2009/063559 A1 | 5/2009 |

OTHER PUBLICATIONS

Official Communication issued in International Patent Application No. PCT/JP2011/055787, mailed on Jun. 14, 2011.

* cited by examiner

*Primary Examiner* — Dean O Takaoka
(74) *Attorney, Agent, or Firm* — Keating & Bennett, LLP

(57) ABSTRACT

A ladder filter including a series arm resonator and a parallel arm resonator disposed on the same common piezoelectric substrate achieves improved miniaturization. The ladder filter includes series arm resonators and parallel arm resonators, which include elastic wave resonators, and are disposed on the same common piezoelectric substrate, at least one parallel arm resonator of the series arm resonators and the parallel arm resonators includes a first resonator and a second resonator electrically connected in parallel to each other, and the first resonator and the second resonator are arranged in parallel or substantially in parallel in a direction perpendicular or substantially perpendicular to an elastic wave propagation direction, on one side outside one series arm resonator of remaining resonators in the elastic wave propagation direction thereof.

22 Claims, 6 Drawing Sheets

LADDER FILTER AND DUPLEXER

BACKGROUND OF THE INVENTION

1. Field of the Invention

The present invention relates to a ladder filter including a plurality of elastic wave resonators. In more detail, the present invention relates to a ladder filter including a series arm resonator and a parallel arm resonator, which include elastic wave resonators, located on one piezoelectric substrate, and a duplexer including the ladder filter, defining at least one band pass filter.

2. Description of the Related Art

In the past, ladder filters have been widely used as band pass filters for mobile phones. In addition, in this type of ladder filter, so as to achieve miniaturization, a series arm resonator and a parallel arm resonator are configured using surface acoustic wave resonators.

For example, in Japanese Unexamined Patent Application Publication No. 2000-201052, an example of such a ladder filter is disclosed. FIG. 8 is a plan view schematically illustrating this ladder filter.

In the ladder filter 1001, series arm resonators S101 to S103 and parallel arm resonators P101 to P102 are configured on a piezoelectric substrate 1002. Each of the series arm resonators S101 to S103 and the parallel arm resonators P101 to P102 has an IDT electrode and reflectors disposed on both sides in the elastic wave propagation direction of the IDT electrode. Here, the diagrammatic representation of the reflector is omitted.

So as to advance miniaturization, each of the above-mentioned resonators is formed on the one piezoelectric substrate 1002.

However, in the ladder filter 1001, on the piezoelectric substrate 1002, the series arm resonators S101 to S103 are spaced from each other with a predetermined distance therebetween. Accordingly, spaces A are provided between the series arm resonators S101 and S102 adjacent to each other and between the series arm resonators S102 and S103 adjacent to each other. In addition, the parallel arm resonators P101 and P102 have been disposed lateral to the spaces A. More specifically, so as to achieve miniaturization, a portion of the parallel arm resonator P101 has been disposed between the series arm resonator S101 and the series arm resonator S102. In the same way, a portion of the parallel arm resonator P102 has been disposed between the series arm resonator S102 and the series arm resonator S103.

However, in such a configuration, not only the above-mentioned spaces A have existed but also a space B has also existed between the parallel arm resonator P101 and the parallel arm resonator P102. The space B is located outside the series arm resonator S102 in the elastic wave propagation direction thereof. In the same way, since the parallel arm resonators P101 and P102 are disposed in the manner described above, a space B has also occurred outside each of the series arm resonators S101 and S103 in the elastic wave propagation direction thereof.

Accordingly, although in order to achieve miniaturization, a portion of the parallel arm resonator P101 or P102 has been caused to be disposed in between the series arm resonators S101 and S102 adjacent to each other or the series arm resonators S102 and S103 adjacent to each other, the spaces A and B have been still large. Accordingly, it has been difficult to further promote miniaturization.

SUMMARY OF THE INVENTION

Preferred embodiments of the present invention provide a ladder filter including a series arm resonator and a parallel arm resonator located on one piezoelectric substrate so as to further promote miniaturization. In addition, preferred embodiments of the present invention provide a duplexer including the ladder filter defining a band pass filter and achieving miniaturization.

A ladder filter according to a first preferred embodiment of the present invention includes a piezoelectric substrate, and a series arm resonator and a parallel arm resonator located on the piezoelectric substrate and including elastic wave resonators.

At least one resonator of the series arm resonator and the parallel arm resonator includes first and second resonators electrically connected in parallel to each other. Outside one resonator of the remaining resonators in an elastic wave propagation direction thereof, the first resonator and the second resonator are arranged in parallel or substantially in parallel in a direction perpendicular or substantially perpendicular to the elastic wave propagation direction.

In the ladder filter according to the first preferred embodiment of the present invention, it is preferable that the first resonator and second resonator are linked together in a direction perpendicular or substantially perpendicular to the elastic wave propagation direction. It is more preferable that each of the first and second resonators includes first and second busbars arranged to face each other in a direction perpendicular or substantially perpendicular to the elastic wave propagation direction and the second busbar of the first resonator and the first busbar of the second resonator are integrated with each other. In this case, it is possible to further reduce the dimension of a region in which the first resonator and the second resonator are provided, in a direction perpendicular or substantially perpendicular to the elastic wave propagation direction.

A ladder filter according to a second preferred embodiment of the present invention includes a piezoelectric substrate, and a series arm resonator and a parallel arm resonator located on the piezoelectric substrate and including elastic wave resonators. At least one resonator of the series arm resonator and the parallel arm resonator includes first and second resonators electrically connected in parallel to each other. One resonator of the remaining resonators is located in a rectangular or substantially rectangular region circumscribed by the first and second resonators. Each of the first and second resonators and the resonator located in the rectangular or substantially rectangular region includes a maximum intersecting width portion and an IDT electrode subjected to intersecting width weighting so that an intersecting width decreases with increasing distance from the maximum intersecting width portion in an elastic wave propagation direction.

In a specific aspect of the ladder filter according to the second preferred embodiment of the present invention, a maximum intersecting width portion of the resonator located in the rectangular or substantially rectangular region is located inside of a first and second resonators side of a virtual line connecting end portions on a same side to each other, in a direction perpendicular or substantially perpendicular to elastic wave propagation directions in the maximum intersecting width portion of the first resonator and the maximum intersecting width portion of the second resonator.

In the ladder filter according to the second preferred embodiment of the present invention, it is preferable that the apodization ratio of the first resonator is different from the apodization ratio of the second resonator. In addition, it is assumed that the apodization ratio means the ratio of a maximum intersecting width to a minimum intersecting width. By causing the apodization ratio of the first resonator and the apodization ratio of the second resonator to be different from each other, it is possible to enhance the degree of freedom of the disposition of the first and second resonators. In addition, it is possible to apply an optimum apodization ratio to each of the first and second resonators, and hence, it is possible to enhance the filter characteristic of the ladder filter.

In another specific aspect of a preferred embodiment of the present invention, the capacitance of the first resonator is preferably different from the capacitance of the second resonator. Accordingly, by causing the capacitance of the first resonator and the capacitance of the second resonator to be different from each other, it is possible to change the areas of the first resonator and the second resonator and enhance the degree of freedom of the disposition of the first and second resonators.

In another specific aspect of the ladder filter according to a preferred embodiment of the present invention, an aspect ratio serving as the ratio of a dimension in a direction perpendicular or substantially perpendicular to the elastic wave propagation direction of the IDT electrode to a dimension in the elastic wave propagation direction is different between the first resonator and the second resonator. Accordingly, since the aspect ratios of the first resonator and the second resonator are different from each other, it is possible to enhance the degree of freedom of the disposition of the first and second resonators. In addition, it is possible to apply an optimum aspect ratio to each of the first resonator and the second resonator, and hence, it is possible to enhance the filter characteristic of the ladder filter.

In another specific aspect of the ladder filter according to a preferred embodiment of the present invention, the number of electrode fingers in a reflector of the first resonator is different from the number of electrode fingers in a reflector of the second resonator. Accordingly, since it is possible to select the number of electrode fingers in reflectors of each resonator in response to the target characteristic of each of the first resonator and the second resonator, it is possible to enhance the filter characteristic of the ladder filter.

In the ladder filter according to a preferred embodiment of the present invention, the resonator including the first and second resonators may be a parallel arm resonator or a series arm resonator. In addition, each parallel arm resonator may be configured so as to include the first and second resonators. In the same way, each series arm resonator may be configured so as to include the first and second resonators.

In addition, a duplexer according to a preferred embodiment of the present invention includes a first band pass filter and a second band pass filter whose pass band is different from the first band pass filter. At least one of the first and second band pass filters includes a ladder filter configured in accordance with a preferred embodiment of the present invention. Accordingly, since it is possible to achieve the miniaturization of at least one of the first and second band pass filters, it is also possible to advance the miniaturization of the duplexer.

In a ladder filter according to a preferred embodiment of the first invention, at least one resonator of a series arm resonator and a parallel arm resonator includes the above-mentioned first and second resonators electrically connected in parallel to each other, and, outside one resonator of the remaining resonators in the elastic wave propagation direction thereof, the first resonator and the second resonator are arranged in parallel or substantially in parallel in a direction perpendicular or substantially perpendicular to the elastic wave propagation direction. Therefore, it is possible to reduce dimensions in the elastic wave propagation directions of the first and second resonators. In addition, it is possible to dispose the first and second resonators in a narrow region lateral to the above-mentioned one resonator of the remaining resonators. Accordingly, in a direction perpendicular or substantially perpendicular to the elastic wave propagation direction, it is not necessary to provide an extra space between the above-mentioned one resonator of the remaining resonators and a resonator adjacent thereto in the perpendicular substantially perpendicular direction.

Accordingly, it is possible to densely dispose a plurality of elastic wave resonators configuring the series arm resonator and the parallel arm resonator, on the piezoelectric substrate, and it is possible to achieve the miniaturization of the ladder filter.

In the ladder filter according to the second preferred embodiment of the present invention, at least one resonator of elastic wave resonators configuring the series arm resonator and the parallel arm resonator includes the first and second resonators electrically connected in parallel to each other in such a way as described above, and one resonator of the remaining resonators is located in a rectangular or substantially rectangular region circumscribed by the first and second resonators. Therefore, it is possible to enhance the disposition density of resonators in a region where the first and second resonators and one resonator of the remaining resonators are disposed. Accordingly, it is possible to effectively enhance a resonator disposition density on the piezoelectric substrate in the ladder filter, and it is possible to achieve the miniaturization of the ladder filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by explaining specific preferred embodiments of the present invention with reference to drawings.

Figure 1A:
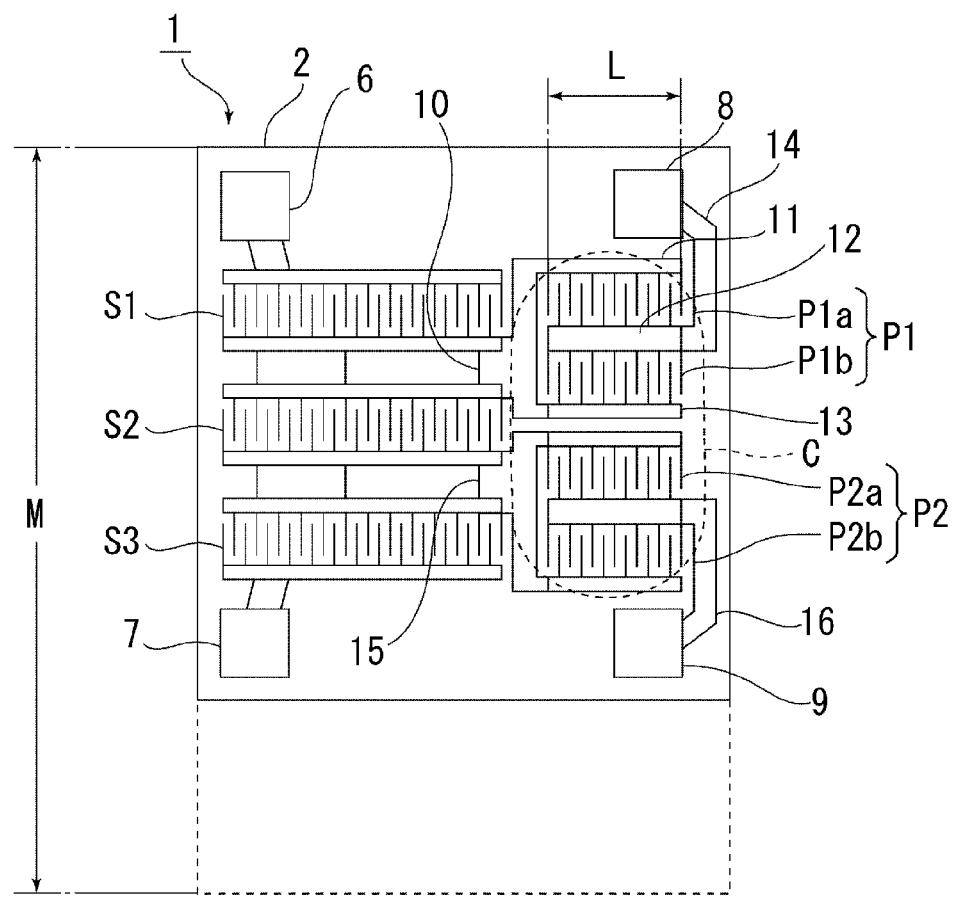
FIG. 1A is a schematic plan view for explaining a ladder filter according to a first preferred embodiment of the present invention.
Figure 1B:
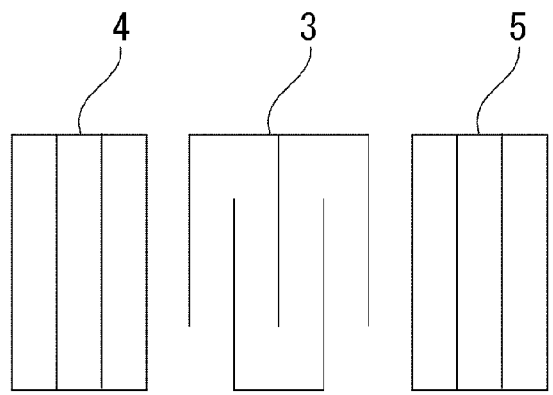
FIG. 1B is a schematic plan view illustrating an electrode structure of a resonator.

FIGS. 1A and 1B are schematic plan views of a ladder filter according to a preferred embodiment of the present invention.

In a ladder filter 1, on a piezoelectric substrate 2, a plurality of series arm resonators S1 to S3 and a plurality of parallel arm resonators P1 and P2 are configured.

The piezoelectric substrate 2 may preferably be formed using piezoelectric single crystal such as $LiNbO_3$ or $LiTaO_3$ or arbitrary piezoelectric ceramics, for example.

The series arm resonators S1 to S3 and the parallel arm resonators P1 and P2 include surface acoustic wave resonators. In FIG. 1B, the electrode structure of the series arm resonator S1 will be described as a representative of the surface acoustic wave resonators. As illustrated in FIG. 1B, reflectors 4 and 5 are located on both sides in the elastic wave propagation direction of an IDT electrode 3. The IDT electrode 3 and the reflectors 4 and 5 are located on the piezoelectric substrate 2, and hence, one-port type surface acoustic wave resonator is configured.

The IDT electrode 3 and the reflectors 4 and 5 include metal films. The formation of the IDT electrode 3 and the reflectors 4 and 5 may preferably be performed using a well-known photolithography technique or other suitable process, for example.

In addition, it is pointed out that, in FIG. 1A, for the sake of easy diagrammatic representation, the IDT electrode of the surface acoustic wave resonator is only illustrated and the diagrammatic representation of reflectors on both sides in the elastic wave propagation direction of an IDT electrode is omitted. Actually, in each of the series arm resonators S1 to S3 and the parallel arm resonators P1 and P2, reflectors are configured on both sides in the elastic wave propagation direction of the IDT electrode.

In the ladder filter 1, on the piezoelectric substrate 2, an input terminal 6, an output terminal 7, ground terminals 8 and 9 are provided and include electrode pads. The electrode pad may be formed using arbitrarily metal or alloy, for example.

Between the input terminal 6 and the output terminal 7, the plural series arm resonators S1 to S3 are connected in series to each other. Therefore, a series arm is configured. Between a conductive pattern 10 connecting the first series arm resonator S1 and the second series arm resonator S2 to each other and the ground terminal 8, the first parallel arm resonator P1 is connected. In the same way, between a conductive pattern 15 electrically connecting the second series arm resonator S2 and the third series arm resonator S3 to each other and the ground terminal 9, the second parallel arm resonator P2 is connected. Therefore, a first parallel arm including the first parallel arm resonator P1 and a second parallel arm including the second parallel arm resonator P2 are configured. Accordingly, a ladder circuit is configured that includes the series arm and the two parallel arms.

In the ladder filter 1 of the present preferred embodiment, the first parallel arm resonator P1 includes a first resonator P1a and a second resonator P1b electrically connected in parallel to each other. Each of the first resonator P1a and the second resonator P1b preferably is a one-port type surface acoustic wave resonator including an IDT electrode and reflectors on both sides in the elastic wave propagation direction of the IDT electrode. Here, the diagrammatic representation of reflectors is also omitted.

One end of the first resonator P1a and one end of the second resonator P1b are subjected to common connection, and connected to the conductive pattern 10 connecting the series arm resonator S1 and the series arm resonator S2 to each other. On the other hand, the other end of the first resonator P1a and the other end of the second resonator P1b are subjected to common connection, and connected to the first ground terminal 8.

The first resonator P1a includes a first busbar 11 and a common busbar 12 as a second busbar, which extend in an elastic wave propagation direction and are spaced from each other in a direction perpendicular or substantially perpendicular to the elastic wave propagation direction. A plurality of electrode fingers, one end of each of which is connected to the first busbar 11, and a plurality of electrode fingers, one end of each of which is connected to the common busbar 12, are mutually inserted therebetween. Therefore, the first resonator P1a is configured.

On the other hand, the second resonator P1b includes the above-mentioned common busbar 12 as a first busbar and a second busbar 13. Owing to the common busbar 12, the second busbar of the first resonator P1a and the first busbar of the second resonator P1b are integrated with each other. Also in the second resonator P1b, a plurality of electrode fingers, one end of each of which is connected to the common busbar 12, and a plurality of electrode fingers, one end of each of which is connected to the second busbar 13, are mutually inserted therebetween.

The above-mentioned common busbar 12 is electrically connected to the first ground terminal 8 owing to the conductive pattern 14.

In the same way as the first parallel arm resonator P1, the second parallel arm resonator P2 also includes a first resonator P2a and a second resonator P2b electrically connected in parallel to each other. The first resonator P2a and the second resonator P2b are configured in the same way as the above-mentioned first resonator P1a and second resonator P1b. In addition, one end of each of the first resonator P2a and the second resonator P2b is connected to a conductive pattern 15. The conductive pattern 15 electrically connects the second series arm resonator S2 and the third series arm resonator S3 to each other.

The other end of each of the first resonator P2a and the second resonator P2b is connected to the second ground terminal 9 owing to a conductive pattern 16.

One of the unique features of the ladder filter 1 of the present preferred embodiment is that a) the above-mentioned first parallel arm resonator P1 includes the first and second resonators P1a and P1b electrically connected in parallel to each other and the above-mentioned second parallel arm resonator P2 includes the first and second resonators P2a and P2b electrically connected in parallel to each other. Another unique feature of the present preferred embodiment is that b), outside the series arm resonator S1 or series arm resonator S3 serving as one resonator of remaining resonators in the elastic wave propagation direction thereof, the first resonator P1a or P2a and the second resonator P1b or P2b are arranged in parallel or substantially in parallel in a direction perpendicular or substantially perpendicular to the elastic wave propagation direction. Therefore, in the ladder filter 1, it is possible to enhance the degree of freedom of the disposition of resonators on the piezoelectric substrate 2, and it is possible to enhance the disposition density of resonators. Accordingly, it is possible to achieve the miniaturization of the ladder filter 1. This will be described more specifically with an example of the related art illustrated in FIG. 8 being compared, as a comparative example, therewith.

Figure 8:
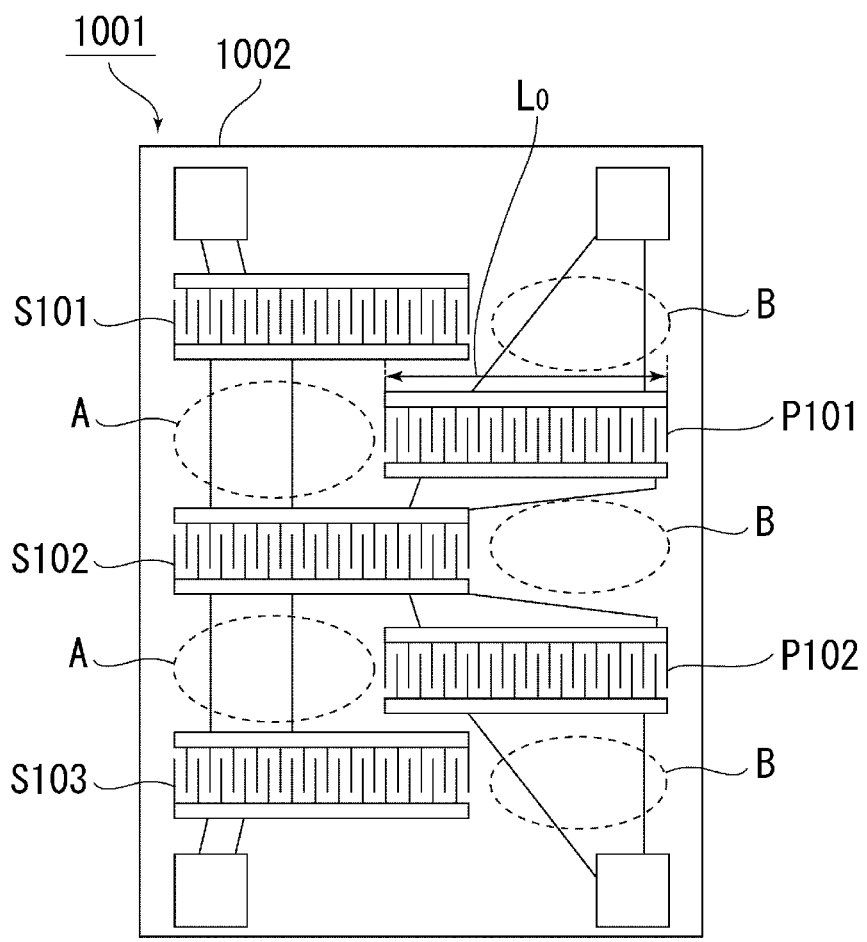
FIG. 8 is a schematic plan view for explaining a ladder filter of the related art.

As is clear from FIG. 8, so as to realize the above-mentioned configuration and achieve miniaturization, in the ladder filter 1001, the first parallel arm resonator P101 is provided so as to be located in a portion of a region between the series arm resonator S101 and the series arm resonator S102. Accordingly, the space A has occurred between the series arm resonator S101 and the series arm resonator S102. In addition to this, the spaces B have occurred outside the series arm resonators S101 and S102 in the elastic wave propagation directions thereof and on the first parallel arm resonator P101 sides thereof. In the same way, the space A has also occurred between the series arm resonator S102 and the series arm resonator S103, and the spaces B have also occurred outside the series arm resonators S102 and S103 in the elastic wave propagation directions thereof. Therefore, it has been difficult to further promote miniaturization.

On the other hand, in the ladder filter 1 of the present preferred embodiment, the first parallel arm resonator P1 corresponding to the first parallel arm resonator P101 is divided so as to include the first resonator P1a and the second resonator P1b electrically connected in parallel to each other.

Therefore, it is possible for dimensions L in the elastic wave propagation directions in the first resonator P1a and the second resonator P1b to be much shorter than a dimension $L_0$ in the elastic wave propagation direction of the parallel arm resonator P101 in FIG. 8.

Accordingly, it is possible to configure the first resonator P1a and the second resonator P1b in a region C located outside the series arm resonator S1 in the elastic wave propagation direction thereof and on the first parallel arm resonator P1 side thereof. In other words, it is not necessary for the parallel arm resonator P1 to be configured so as to be located in a region between the series arm resonator S1 and the series arm resonator S2. Therefore, it is possible to reduce the space A illustrated in FIG. 8.

In addition, as described above, the lengths L of the first resonator P1a and the second resonator P1b are caused to be much shorter. Accordingly, in a region outside the first series arm resonator S1 in the elastic wave propagation direction thereof, it is possible to configure the first resonator P1a and the second resonator P1b. Therefore, it is also possible to reduce the space B illustrated in FIG. 8.

The second parallel arm resonator P2 is also configured in the same way as the first parallel arm resonator P1. Accordingly, it is also possible to reduce the space A between the series arm resonator S2 and the series arm resonator S3 and the spaces B lateral to the series arm resonator S2 and the series arm resonator S3.

Since having such a configuration as described above, it is possible to reduce a dimension M in a direction perpendicular or substantially perpendicular to the above-mentioned elastic wave propagation direction of the piezoelectric substrate 2. In FIG. 1, a dashed line indicates the external form of the piezoelectric substrate 1002 of the ladder filter 1001 illustrated in FIG. 8. As is clear from a comparison between the dashed line and the external form of the piezoelectric substrate 2 indicated by a solid line, it is possible to considerably shorten the above-mentioned dimension M of the piezoelectric substrate 2. Accordingly, it is understood that it is possible to achieve miniaturization in the ladder filter 1.

In addition, in the present preferred embodiment, in the first parallel arm resonator P1, the first resonator P1a and the second resonator P1b are directly linked together via the common busbar 12. Accordingly, that also allows the above-mentioned dimension M to be further reduced.

However, in various preferred embodiments of the present invention, it is not necessary for one busbar of the first resonator P1a and one busbar of the second resonator P1b to be integrated with each other.

More specifically, the configuration where the first resonator P1a and the second resonator P1b are physically linked together is not limited to a structure utilizing the common busbar 12.

While, in the present preferred embodiment, as described above, the first parallel arm resonator P1 and the second parallel arm resonator P2 are preferably divided so as to include the first resonators P1a and P2a and the second resonators P1b and P2b, respectively, electrically connected in parallel to each other, such a configuration also indicates a favorable filter characteristic in the same way as the ladder filter 1001. This will be described with a specific experimental example being cited.

A $LiNbO_3$ substrate was preferably used as the piezoelectric substrate 2, and the first to third series arm resonators S1 to S3 and the first and second parallel arm resonators P1 and P2 were formed preferably in accordance with the following non-limiting example of a possible specification.

The series arm resonators S1 to S3: the number of pairs of electrode fingers=40 pairs, an electrode finger intersecting width=108 μm, and an electrode finger pitch=1.9650 μm The first resonator P1a: the number of pairs of electrode fingers=35 pairs, an electrode finger intersecting width=72 μm, and an electrode finger pitch=2.0525 μm The second resonator P1b: the number of pairs of electrode fingers=35 pairs, an electrode finger intersecting width=72 μm, and an electrode finger pitch=2.0525 μm The first resonator P2a: the number of pairs of electrode fingers=47 pairs, an electrode finger intersecting width=72 μm, and an electrode finger pitch=2.0575 μm The second resonator P2b: the number of pairs of electrode fingers=48 pairs, an electrode finger intersecting width=72 μm, and an electrode finger pitch=2.0575 μm In addition, the number of electrode fingers and an electrode finger pitch of a reflector in each of the first to third series arm resonators S1 to S3 were 10 and 1.9650 μm, respectively.

In addition, the number of electrode fingers and an electrode finger pitch of a reflector in each of the first resonator P1a and the second resonator P1b were 10 and 2.0525 μm, respectively. The number of electrode fingers and an electrode finger pitch of a reflector in each of the first resonator P2a and the second resonator P2b were 10 and 2.0575 μm, respectively.

For comparison, in accordance with the following specification, on the piezoelectric substrate 1002 including the same piezoelectric material, the series arm resonators S101 to S103 and the parallel arm resonators P101 and P102 were preferably formed in accordance with the following non-limiting example of a possible specification.

The first to third series arm resonators S101 to S103 were formed in accordance with the same specification as the above-mentioned series arm resonators S1 to S3.

Figure 2:
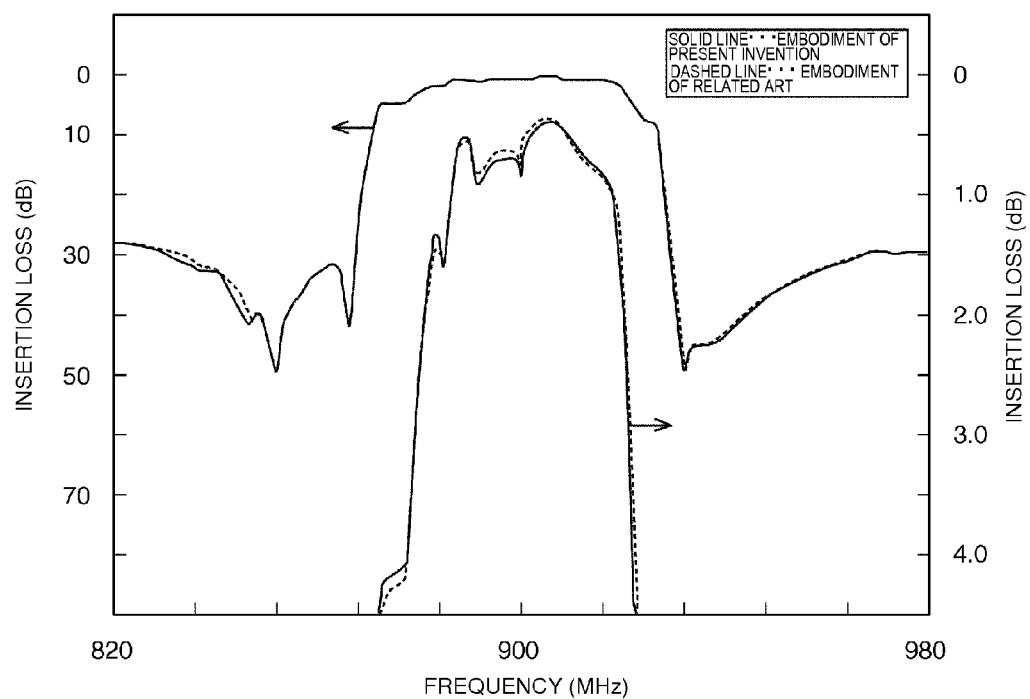
FIG. 2 is a diagram illustrating filter characteristics of the first preferred embodiment of the present invention and a ladder filter of the related art prepared for comparison.

The parallel arm resonator P101: the number of pairs of electrode fingers=70 pairs, an electrode finger intersecting width=72 μm, and an electrode finger pitch=2.0525 μm The parallel arm resonator P102: the number of pairs of electrode fingers=95 pairs, an electrode finger intersecting width=72 μm, and an electrode finger pitch=2.0575 μm FIG. 2 is a diagram illustrating the attenuation frequency characteristics of the ladder filter 1 and the ladder filter 1001 of the related art as a first comparative example, obtained in such a way as described above.

As is clear from FIG. 2, the ladder filter 1 represents a filter characteristic equivalent to the ladder filter 1001. Accordingly, even if the parallel arm resonators P1 and P2 are divided so as to include the first resonators P1a and P2a and the second resonators P1b and P2b, respectively, it is possible to advance miniaturization without the filter characteristic being lowered.

In addition, while, in the present preferred embodiment, each of the first and second parallel arm resonators P1 and P2 is divided so as to include the first resonator and the second resonator, only one parallel arm resonator of the first parallel arm resonator P1 and the second parallel arm resonator P2 may be subjected to parallel division as described above.

In addition, the parallel arm resonator may not be subjected to parallel division but at least one resonator of the first to third series arm resonators S1 to S3 may be subjected to parallel division as described above.

In any case, it is only necessary for at least one resonator of a plurality of resonators configuring the ladder filter, namely, at least one resonator of the series arm resonators and the parallel arm resonators, to be subjected to parallel division as described above.

Usually, in an elastic wave resonator, a dimension in an elastic wave propagation direction is longer than a dimension in a direction perpendicular or substantially perpendicular to the elastic wave propagation direction. In a resonator subjected to parallel division, as described above, it is possible to reduce the dimension L in the elastic wave propagation direction in each of the first and second resonators. Accordingly, if at least one resonator subjected to parallel division is configured, it is possible to reduce a dimension in an elastic wave propagation direction in the resonator. Therefore, even if, on one side outside one resonator of the remaining resonators in the elastic wave propagation direction thereof, a resonator having a parallel division structure is disposed, it is possible to configure the resonator subjected to parallel division on the piezoelectric substrate without increasing a dimension in the elastic wave propagation direction of the piezoelectric substrate.

In addition to this, since, in a resonator having a parallel division structure in the same way as the first parallel arm resonator P1, it is possible to shorten the length L in the elastic wave propagation direction as described above, it is possible for the parallel arm resonator P1 to be configured so as not to be between the series arm resonators S1 and S2. In other words, it is not necessary for a resonator having the parallel division structure to be disposed between two other resonators spaced from each other in a direction perpendicular or substantially perpendicular to an elastic wave propagation direction and adjacent to each other. Accordingly, it is possible to significantly reduce the dimension of the piezoelectric substrate 2 in a direction perpendicular or substantially perpendicular to the elastic wave propagation direction, in such a way as described above.

Figure 3:
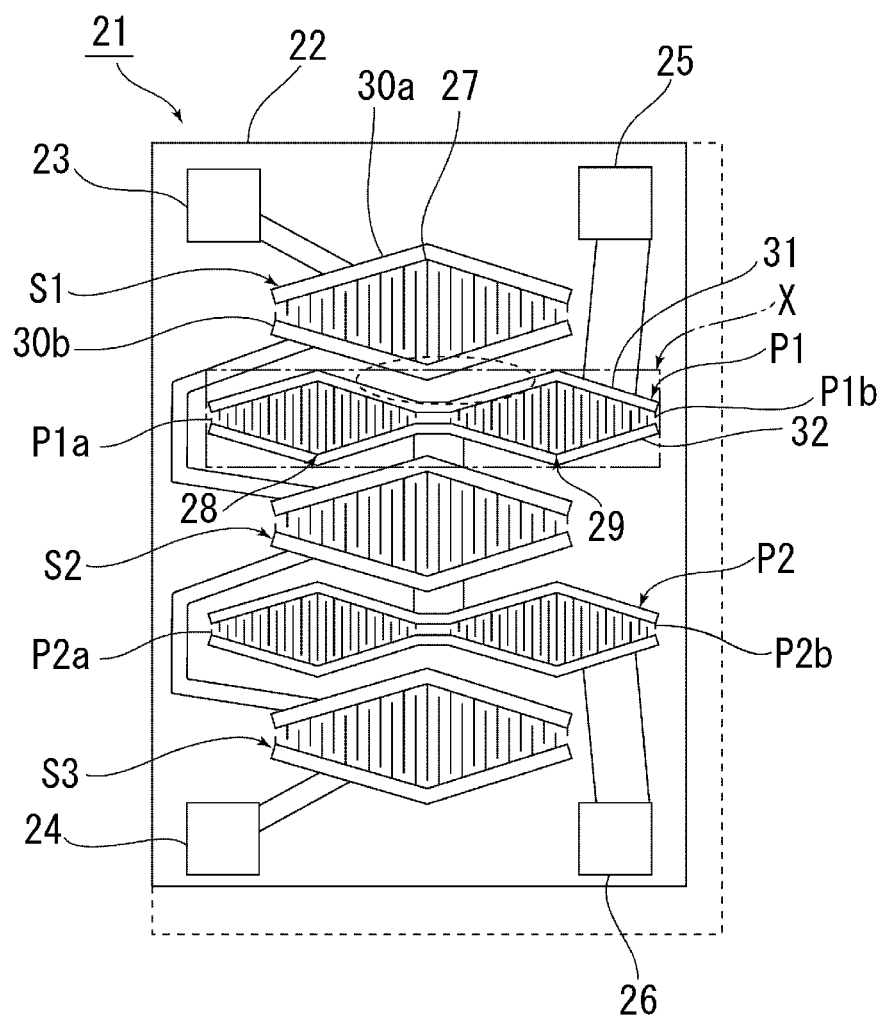
FIG. 3 is a schematic plan view for explaining a ladder filter according to a second preferred embodiment of the present invention.

FIG. 3 is the schematic plan view of a ladder filter according to a second preferred embodiment of the present invention. In a ladder filter 21 of the second preferred embodiment, in the same way as the first preferred embodiment, first to third series arm resonators S1 to S3 and first and second parallel arm resonators P1 and P2 are configured on a piezoelectric substrate 22. In addition, on the piezoelectric substrate 22, an input terminal 23, an output terminal 24, and first and second ground terminals 25 and 26 are provided.

In the same way as the first preferred embodiment, the first to third series arm resonators S1 to S3 are connected in series to each other between the input terminal 23 and the output terminal 24. In addition, one end of the first parallel arm resonator P1 is connected to the series arm resonators S1 and S2 and the other end thereof is connected to the first ground terminal 25. In addition, one end of the second parallel arm resonator P2 is connected to the second and third series arm resonators S2 and S3 and the other end thereof is connected to the second ground terminal 26. Accordingly, the ladder filter 21 of the second preferred embodiment preferably has the same circuit configuration as the ladder filter 1 of the first preferred embodiment.

The ladder filter 21 of the second preferred embodiment is different from the ladder filter 1 of the first preferred embodiment in the structures of IDT electrodes in the series arm resonators S1 to S3 and the parallel arm resonators P1 and P2 and the disposition of these resonators.

In addition, also in FIG. 3, in the same way as FIG. 1, the diagrammatic representation of reflectors on both sides of an IDT electrode is omitted.

As illustrated in the drawing, in the present preferred embodiment, the first to third series arm resonators S1 to S3 are subjected to intersecting width weighting. This intersecting width weighting of the series arm resonator S1 will be described as a representative.

In the IDT electrode, an intersecting width is weighted so that the intersecting width sequentially decreases from a portion in which the intersecting width becomes a local maximum, namely, a maximum intersecting width portion 27, toward both sides in an elastic wave propagation direction. In the series arm resonator S1, first and second busbars 30a and 30b are located along the external periphery of a region where the intersecting width changes, namely, the external periphery of a region surrounded by envelope curves, so as to be spaced from the external form with a predetermined distance therebetween. Accordingly, the series arm resonator S1 preferably has a rhomboid external shape. The same is preferably true on the series arm resonator S2 and the series arm resonator S3.

On the other hand, the first parallel arm resonator P1 has a parallel division structure in the same way as the first preferred embodiment. More specifically, the first parallel arm resonator P1 includes a first resonator P1a and a second resonator P1b electrically connected in parallel to each other. In the same way as the series arm resonator S1, the first resonator P1a and the second resonator P1b are also subjected to intersecting width weighting. Accordingly, in the first and second resonators P1a and P1b, the intersecting width sequentially decreases from maximum intersecting width portions 28 and 29 toward both sides in an elastic wave propagation direction. Accordingly, the first resonator P1a and the second resonator P1b also have substantially rhomboid shapes. In addition, also in the first and second resonators P1a and P1b, each of the first busbar 31 and the second busbar 32 has a shape where each of the first busbar 31 and the second busbar 32 is spaced from the envelope curve of intersecting width weighting with a predetermined distance therebetween and located along the envelope curve. In addition, each of the first busbar 31 and the second busbar 32 is integrated in the first and second resonators P1a and P1b. While reflectors are preferably located on both sides in an elastic wave propagation direction in each of the P1a and the P1b, if the pitches of reflectors between the P1a and the P1b are equal to each other, one reflector may be shared between the P1a and the P1b. Furthermore, by placing the P1a and the P1b close together, a reflector between the P1a and the P1b may be eliminated. By adopting such a configuration, it is possible to reduce a dimension in the elastic wave propagation direction.

In the same way, the second parallel arm resonator P2 also preferably includes a first resonator P2a and a second resonator P2b electrically connected in parallel to each other.

In the second preferred embodiment, since each of the first parallel arm resonator P1 and the second parallel arm resonator P2 preferably has the above-mentioned parallel division structure and the parallel arm resonators P1 and P2 are disposed as illustrated in the drawing, it is possible to increase the miniaturization of the ladder filter 21. This will be described in detail hereinafter.

Figure 4:
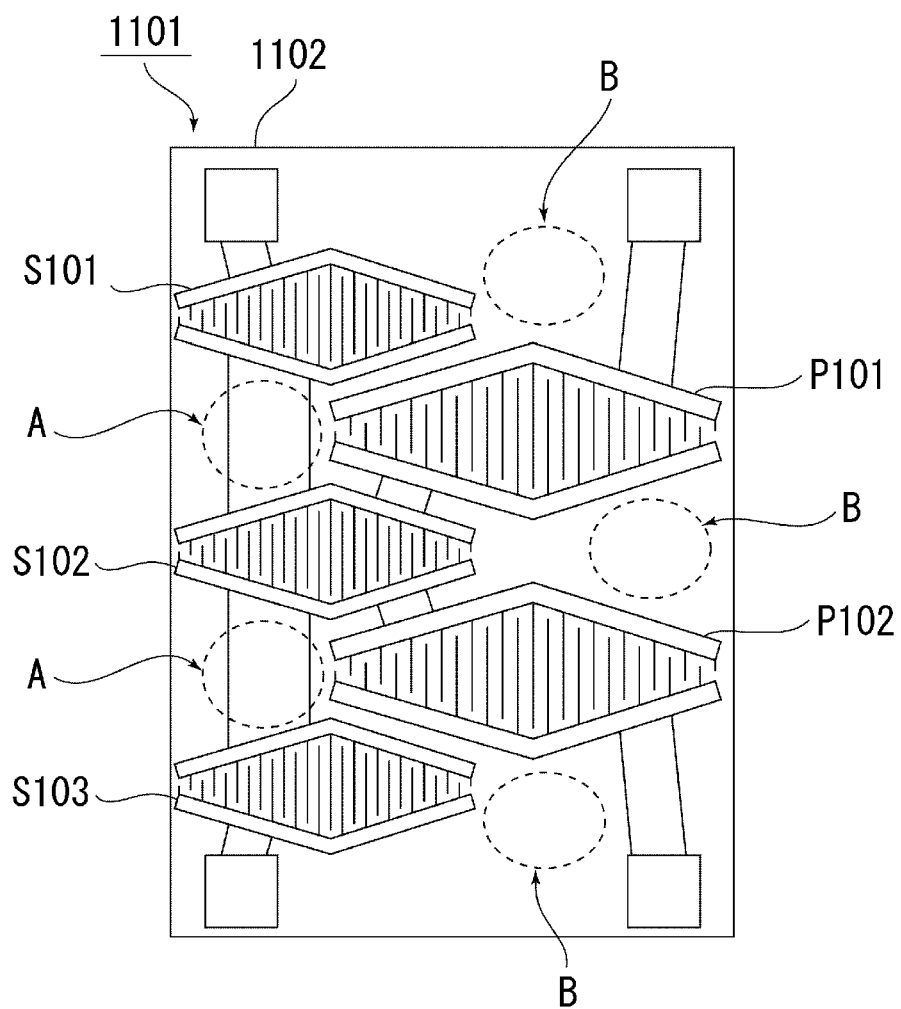
FIG. 4 is a schematic plan view for explaining a ladder filter of the related art to be compared with the second preferred embodiment of the present invention.

FIG. 4 is a schematic plan view illustrating a ladder filter 1101 of a second comparative example to be compared with the ladder filter 21. On a piezoelectric substrate 1102, in the same way as the second preferred embodiment, series arm resonators S101 to S103, a first parallel arm resonator P101, and a second parallel arm resonator P102 are configured. In the same way as the second preferred embodiment, each of the series arm resonators S101 to S103 and the parallel arm resonators P101 and P102 is also subjected to intersecting width weighting so that the intersecting width sequentially decreases from a maximum intersecting width portion toward an elastic wave propagation direction. Accordingly, in the same way as the second preferred embodiment, each of the series arm resonators S101 to S103 and the parallel arm resonators P101 and P102 has a substantially rhomboid shape.

Accordingly, so as to achieve miniaturization, in the ladder filter 1101, a portion of the first parallel arm resonator P101 whose shape is relatively large is disposed so as to be located in a region between the series arm resonator S101 and the series arm resonator S102. In the same way, a portion of the parallel arm resonator P102 is also disposed so as to be located in a region between the series arm resonator S102 and the series arm resonator S103. More specifically, in order to densely dispose a plurality of rhomboid shapes, the portions of the parallel arm resonators P101 and P102 are disposed so as to be located in regions between the series arm resonators S101 to S103.

However, even if disposed in such a way as described above, it is difficult to cause the parallel arm resonator P101 whose capacitance is large and whose shape is relatively large to be located completely in a region between the series arm resonators S101 and S102 adjacent to each other. Therefore, spaces have occurred that are indicated by arrows A and arrows B in FIG. 4. More specifically, the space A has occurred between the series arm resonator S101 and the series arm resonator S102, and it has been difficult to keep the space B from occurring on one side outside each of the series arm resonators S101 to S103 in the elastic wave propagation direction thereof.

On the other hand, in the ladder filter 21, the parallel arm resonator P1 is subjected to parallel division so as to include the first resonator P1a and the second resonator P1b. Therefore, it is possible to reduce the dimension of the maximum intersecting width portion of each of the first and second resonators P1a and P1b in a direction perpendicular or substantially perpendicular to the elastic wave propagation direction. Accordingly, it is possible to reduce the dimension of the parallel arm resonator P1 in a direction perpendicular or substantially perpendicular to the elastic wave propagation direction.

Furthermore, the series arm resonators S1 and S2 and the parallel arm resonator P1 are disposed so that an end portion on a parallel arm resonator P1 side in the maximum intersecting width portion 27 of the series arm resonator S1 or series arm resonator S2 is located in one rectangular or substantially rectangular region X circumscribed with the first resonator P1a and the second resonator P1b. Accordingly, a dimension in a direction connecting the series arm resonator S1, the parallel arm resonator P1, and the series arm resonator S2 is reduced.

In addition, in the present preferred embodiment, the second parallel arm resonator P2 is also configured in the same way as the first parallel arm resonator P1, and the parallel arm resonator P2 is disposed between the series arm resonators S2 and S3 in the same way as described above.

Accordingly, in the ladder filter 21, it is possible to reduce the dimension of the piezoelectric substrate 22 in a direction perpendicular or substantially perpendicular to the above-mentioned elastic wave propagation direction. In FIG. 3, a dashed line indicates the external form of the piezoelectric substrate 1102 of the ladder filter 1101. As is clear from comparison between the dashed line and the external form of the piezoelectric substrate 22 in FIG. 3, it is possible to reduce the dimension in a direction perpendicular or substantially perpendicular to the above-mentioned elastic wave propagation direction in the ladder filter 21.

Furthermore, the first and second resonators P1a and P1b are linked together in the elastic wave propagation direction, and the maximum intersecting width portions 27 of the series arm resonators S1 and S2 face each other in a link portion between the first and second resonators P1a and P1b, namely, a region where the intersecting width is smallest. Furthermore, a region where the series arm resonators S1 to S3 are located is contained in a region where the parallel arm resonators P1 and P2 are disposed with respect to the elastic wave propagation direction. Therefore, a dimension of a maximum portion in the elastic wave propagation direction of the whole region where the series arm resonators S1 to S3 and the parallel arm resonators P1 and P2 are configured is a dimension in the elastic wave propagation direction of a portion where the first and second parallel arm resonators P1 and P2 are configured. Therefore, in the ladder filter 21, compared with the ladder filter 1101, it is possible to shorten the dimension in the elastic wave propagation direction.

Accordingly, in the ladder filter 21, it is possible to advance miniaturization in the same way as the first preferred embodiment.

Figure 5:
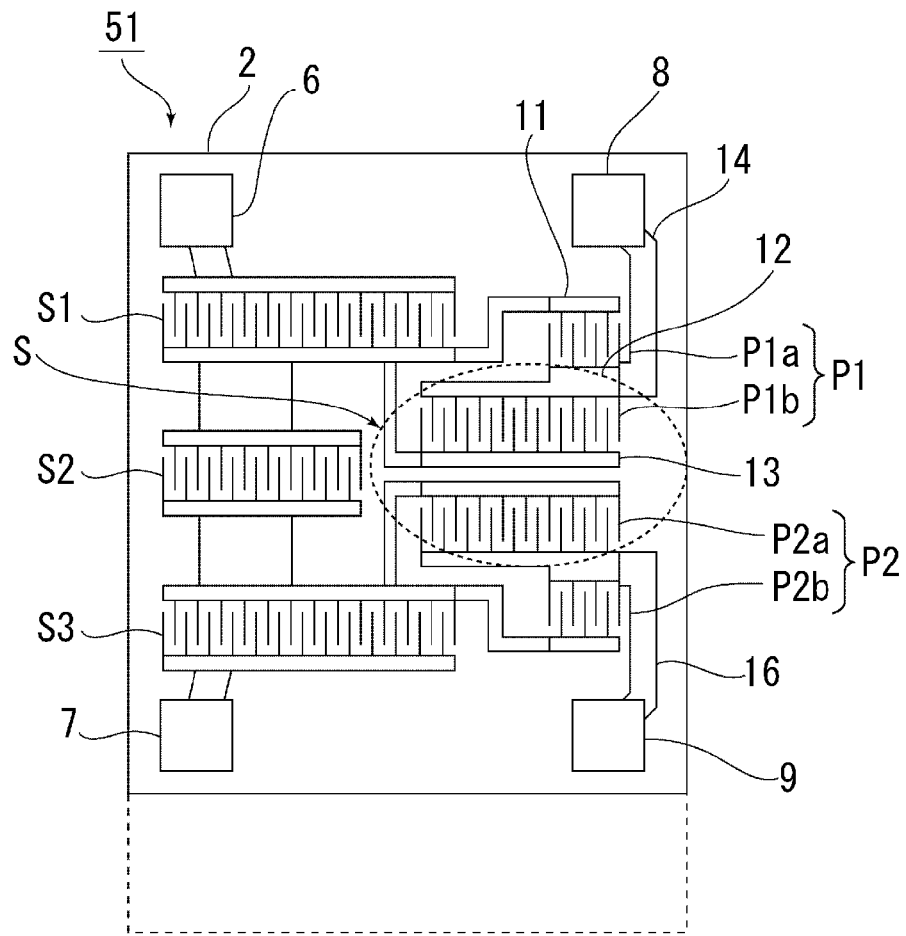
FIG. 5 is a schematic plan view for explaining an example of a modification to a ladder filter of a preferred embodiment of the present invention.

FIG. 5 is a schematic plan view illustrating an example of a modification to the ladder filter 1 of the first preferred embodiment. In a ladder filter 51 illustrated in FIG. 5, in the same way as the ladder filter 1 of the first preferred embodiment, series arm resonators S1 to S3 and parallel arm resonators P1 and P2 are configured on the piezoelectric substrate 2. Here, each resonator also includes a normal type IDT electrode. Also in FIG. 5, it is pointed out that the diagrammatic representation of reflectors on both sides of the IDT electrode is omitted.

The ladder filter 51 is different from the ladder filter 1 in that the number of pairs of electrode fingers of the second series arm resonator S2 is caused to be smaller than the number of pairs of electrode fingers of each of the first and third series arm resonators S1 and S3, the number of pairs of electrode fingers of the first resonator P1a and the number of pairs of electrode fingers of the second resonator P1b are different from each other in the first parallel arm resonator P1, and the number of pairs of electrode fingers of the first resonator P2a and the number of pairs of electrode fingers of the second resonator P2b are different from each other in the second parallel arm resonator P2.

More specifically, in the second series arm resonator S2, since the number of pairs of electrode fingers is relatively small, a dimension in the elastic wave propagation direction is caused to be relatively short. Therefore, it is possible to provide a relatively large space S outside the series arm resonator S2 in the elastic wave propagation direction thereof.

On the other hand, the first parallel arm resonator P1 includes first and second resonators P1a and P1b electrically connected to each other. Here, the number of pairs of electrode fingers of the second resonator P1b is caused to be larger than the number of pairs of electrode fingers of the first resonator P1a. Accordingly, a dimension in the elastic wave propagation direction of the second resonator P1b is caused to be larger than a dimension in the elastic wave propagation direction of the first resonator P1a. In this way, in a modification of a preferred embodiment of the present invention, the numbers of pairs of electrode fingers of the first resonator and the second resonator in the parallel division structure may be caused to be different from each other.

Here, the first and second resonators P1a and P1b are disposed so that the first resonator P1a is located lateral to the first series arm resonator S1 in the elastic wave propagation direction thereof and the second resonator P1b is located lateral to the second series arm resonator S2 in the elastic wave propagation direction thereof. And, the second resonator P1b whose dimension in the elastic wave propagation direction is relatively large is disposed in the space S.

In the second parallel arm resonator P2, the number of pairs of electrode fingers of the first resonator P2a is caused to be larger than the number of pairs of electrode fingers of the second resonator P2b. Accordingly, a dimension in the elastic wave propagation direction of the first resonator P2a is caused to be relatively large. And, the first resonator P2a is located in the space S lateral to the second series arm resonator S2, and the second resonator P2b is located outside the third series arm resonator S3 in the elastic wave propagation direction thereof.

While, in the present preferred embodiment, as described above, the relatively large space S is provided lateral to the second series arm resonator S2, the second resonator P1b in the first parallel arm resonator P1 and the first resonator P2a in the second parallel arm resonator P2, whose dimensions in the above-mentioned elastic wave propagation directions are relatively large, are disposed in the space S. Accordingly, it is possible to densely dispose the resonators in the above-mentioned space S.

In addition, in the same way as the first preferred embodiment, the first and second parallel arm resonators P1 and P2 have parallel division structures. Accordingly, it is possible to reasonably dispose at least one resonator of the first and second resonators in a region outside the series arm resonator in the elastic wave propagation direction thereof.

Accordingly, it is possible to densely dispose the series arm resonators S1 to S3 and the parallel arm resonators P1 and P2 on the piezoelectric substrate 2.

A dashed line in FIG. 5 indicates the external form of the piezoelectric substrate in the first comparative example illustrated in FIG. 8. As is clear from comparison between this dashed line and the external form of the piezoelectric substrate 2 in FIG. 5, in the present preferred embodiment, it is also possible to significantly reduce a dimension in a direction perpendicular or substantially perpendicular to the elastic wave propagation direction. Accordingly, it is possible to achieve the miniaturization of the ladder filter 51.

In the example of a modification illustrated in FIG. 5, since the number of pairs of electrode fingers of the first resonator P1a is different from the number of pairs of electrode fingers of the second resonator P1b as described above, dimensions in the elastic wave propagation directions are different from each other. Therefore, it is possible to dispose the first and second resonators P1a and P1b, different in size from each other as described above, in an adequate space in response to the respective sizes thereof. Accordingly, it is possible to enhance the degree of freedom of the disposition of a plurality of resonators in a ladder filter.

Figure 6:
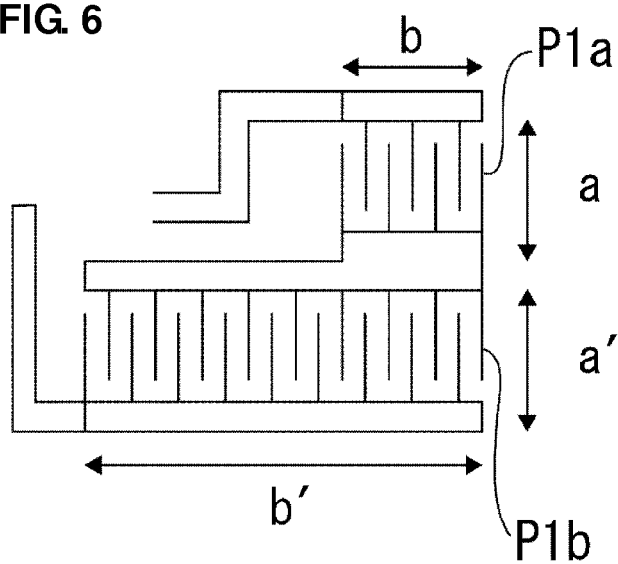
FIG. 6 is a schematic plan view for explaining electrode structures of first and second resonators in a ladder filter according to an example of a modification to the first preferred embodiment of the present invention.

In addition, while, in FIG. 5, the numbers of pairs of electrode fingers are caused to be different from each other, the aspect ratios of the first resonator P1a and the second resonator P1b may be caused to be different from each other as illustrated in FIG. 6. Here, when citing the first resonator P1a as an example, it is assumed that the aspect ratio means a ratio of a dimension a in a direction perpendicular or substantially perpendicular to the elastic wave propagation direction to a dimension b in the elastic wave propagation direction, namely, a/b. Here, as illustrated in FIG. 6, when the longitudinal direction dimension of the second resonator P1b is a' and the lateral direction dimension thereof is b', the aspect ratio a'/b' may be different from the aspect ratio a/b of the first resonator P1a. In this way, by causing the aspect ratios of the first and second resonators P1a and P1b to be different from each other, it is also possible to dispose the first and second resonators P1a and P1b in an arbitrary space in response to a difference in aspect ratio. Accordingly, it is possible to enhance the degree of freedom of the disposition of a plurality of resonators. In addition, by applying an optimum aspect ratio to each of the first and second resonators, it is also possible to enhance a filter characteristic.

In addition, while, in the ladder filter 21 of the second preferred embodiment illustrated in FIG. 3, the first resonator P1a and the second resonator P1b preferably are intersecting width weighted, intersecting width weighting in the first resonator P1a may also be different from intersecting width weighting in the second resonator P1b. By causing the resonators to be different in intersecting width weighting, the shape of a busbar along the envelope curve changes. Therefore, when causing the resonators to be different in intersecting width weighting, the shape of the first resonator P1a and the shape of the second resonator P1b turn out to be different from each other.

Also in this case, it is only necessary to dispose the first and second resonators P1a and P1b in an arbitrary space in response to a difference in shape. Accordingly, it is possible to enhance the degree of freedom of the disposition of a plurality of resonators. In addition, by subjecting each of the first resonator P1a and the second resonator P1b to optimum intersecting width weighting, it is also possible to improve a filter characteristic.

While, as described above, in the first and second preferred embodiments and the example of a modification a preferred embodiment in FIG. 5, the diagrammatic representation of reflectors is omitted, actually the reflectors are disposed on both sides in the elastic wave propagation direction of the IDT electrode as illustrated in FIG. 1B. The number of electrode fingers of a reflector in the first resonator P1a in the above-mentioned parallel division structure may be different from the number of electrode fingers of a reflector in the second resonator P1b. Also in this case, since the shape of the first resonator P1a and the shape of the second resonator P1b are different from each other when the numbers of electrode fingers of reflectors are different from each other, it is possible to enhance the degree of freedom of the disposition of a plurality of resonators, after all. In addition to this, by utilizing a reflector having the optimum number of electrode fingers for each of the first resonator P1a and the second resonator P1b, it is also possible to improve a filter characteristic.

A ladder filter according to the present invention is not limited to a ladder filter including three series arm resonators and two parallel arm resonators in the same way as the first and second preferred embodiments described above, and may also be applied to an arbitrary ladder filter including a series arm resonator and a parallel arm resonator. In addition, while a ladder filter preferably utilizing a surface acoustic wave has been described, the present invention may also be applied to a ladder filter utilizing a boundary acoustic wave.

Figure 7:
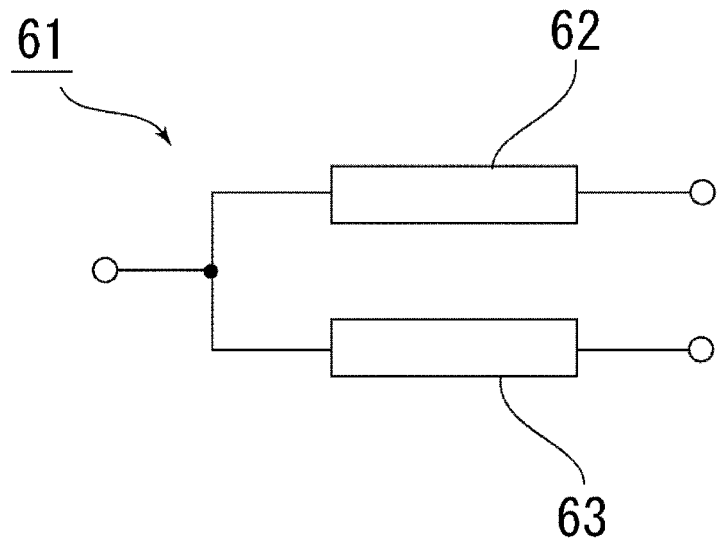
FIG. 7 is a circuit diagram illustrating an example of a duplexer according to a preferred embodiment of the present invention.

FIG. 7 is a block diagram illustrating an example of a duplexer according to another preferred embodiment of the present invention. A duplexer 61 includes a first band pass filter 62 and a second band pass filter 63 whose pass band is different from the first band pass filter 62. In the duplexer 61, the first band pass filter 62 includes a ladder filter of a preferred embodiment of the present invention. Accordingly, since it is possible to achieve the miniaturization of the first band pass filter 62, it is possible to advance the miniaturization of the duplexer 61. In addition, the first band pass filter 62 may not include a ladder filter according to a preferred embodiment of the present invention, but the second band pass filter 63 may include a ladder filter according to a preferred embodiment of the present invention. In addition, both of the first and second band pass filters may be ladder filters according to a preferred embodiment of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter comprising:
a piezoelectric substrate; and
at least one series arm resonator and at least one parallel arm resonator located on the piezoelectric substrate and including elastic wave resonators; wherein
at least one resonator of the at least one series arm resonator and the at least one parallel arm resonator includes first and second resonators electrically connected in parallel to each other, and, outside of a space occupied by one resonator of remaining resonators of the at least one series arm resonator and the at least one parallel arm resonator in an elastic wave propagation direction thereof, the first resonator and the second resonator are arranged in parallel or substantially in parallel to one another in a direction perpendicular or substantially perpendicular to the elastic wave propagation direction.

2. The ladder filter according to claim 1, wherein the first and second resonators are connected together in a direction perpendicular or substantially perpendicular to the elastic wave propagation direction.

3. The ladder filter according to claim 2, wherein each of the first and second resonators includes first and second busbars, connected to a plurality of electrode fingers, and the second busbar of the first resonator and the first busbar of the second resonator are integrated with each other.

4. The ladder filter according to claim 1, wherein a capacitance of the first resonator is different from a capacitance of the second resonator.

5. The ladder filter according to claim 1, wherein an aspect ratio defined as a ratio of a dimension of the first resonator in a direction perpendicular or substantially perpendicular to an elastic wave propagation direction to a dimension of the first resonator in the elastic wave propagation direction is different from an aspect ratio of the second resonator.

6. The ladder filter according to claim 1, wherein a number of electrode fingers in a reflector of the first resonator is different from a number of electrode fingers in a reflector of the second resonator.

7. The ladder filter according to claim 1, wherein the at least one resonator including the first and second resonators is a parallel arm resonator.

8. The ladder filter according to claim 7, wherein each of the at least one parallel arm resonator includes the first and second resonators.

9. The ladder filter according to claim 1, wherein the at least one resonator including the first and second resonators is a series arm resonator.

10. The ladder filter according to claim 9, wherein each of the least one series arm resonator includes the first and second resonators.

11. A duplexer comprising:
a first band pass filter; and
a second band pass filter different from the first band pass filter; wherein
at least one of the first band pass filter and the second band pass filter includes the ladder filter according to claim 1.

12. A ladder filter comprising:
a piezoelectric substrate; and
a series arm resonator and a parallel arm resonator located on the piezoelectric substrate and including elastic wave resonators; wherein
at least one resonator of the series arm resonator and the parallel arm resonator includes first and second resonators electrically connected in parallel to each other;
at least one resonator of remaining resonators is located in a rectangular or substantially rectangular region circumscribed by the first and second resonators, and each of the first and second resonators and the resonator located in the rectangular or substantially rectangular region and being one resonator of the remaining resonators includes a maximum intersecting width portion and an IDT electrode that is intersecting width weighted so that an intersecting width decreases from the maximum intersecting width portion toward both sides in an elastic wave propagation direction.

13. The ladder filter according to claim 12, wherein between the maximum intersecting width portions of the first and second resonators, a maximum intersecting width portion of the resonator located in the rectangular or substantially rectangular region gets is located on a first and second resonators side of a virtual line connecting end portions on a same side to each other, in a direction perpendicular or substantially perpendicular to elastic wave propagation directions in the maximum intersecting width portions of the first and second resonators.

14. The ladder filter according to claim 12, wherein in the first and second resonators subjected to weighting so as to include the maximum intersecting width portions, an apodization ratio defining a ratio of the maximum intersecting width of the first resonator to a minimum intersecting width thereof is different from an apodization ratio of the second resonator.

15. The ladder filter according to claim 12, wherein a capacitance of the first resonator is different from a capacitance of the second resonator.

16. The ladder filter according to claim 12, wherein an aspect ratio defining a ratio of a dimension of the first resonator in a direction perpendicular or substantially perpendicular to an elastic wave propagation direction in an IDT electrode thereof to a dimension in the elastic wave propagation direction is different from an aspect ratio of the second resonator.

17. The ladder filter according to claim 12, wherein a number of electrode fingers in a reflector of the first resonator is different from a number of electrode fingers in a reflector of the second resonator.

18. The ladder filter according to claim 12, wherein the resonator including the first and second resonators is a parallel arm resonator.

19. The ladder filter according to claim 18, wherein each parallel arm resonator includes the first and second resonators.

20. The ladder filter according to claim 12, wherein the resonator including the first and second resonators is a series arm resonator.

21. The ladder filter according to claim 20, wherein each series arm resonator includes the first and second resonators.

22. A duplexer comprising:
   a first band pass filter; and
   a second band pass filter different from the first band pass filter; wherein
   at least one of the first band pass filter and the second band pass filter includes the ladder filter according to claim 12.

* * * * *